US011211276B2

(12) United States Patent
Soejima

(10) Patent No.: US 11,211,276 B2
(45) Date of Patent: Dec. 28, 2021

(54) ANTI-EJECTION APPARATUS FOR WAFER UNITS

(71) Applicant: DISCO CORPORATION, Tokyo (JP)

(72) Inventor: Yoshikatsu Soejima, Tokyo (JP)

(73) Assignee: DISCO CORPORATION, Tokyo (JP)

(*) Notice: Subject to any disclaimer, the term of this patent is extended or adjusted under 35 U.S.C. 154(b) by 0 days.

(21) Appl. No.: 16/898,563

(22) Filed: Jun. 11, 2020

(65) Prior Publication Data

US 2020/0402825 A1  Dec. 24, 2020

(30) Foreign Application Priority Data

Jun. 18, 2019 (JP) .............................. JP2019-112882

(51) Int. Cl.
*H01L 21/673* (2006.01)

(52) U.S. Cl.
CPC .. *H01L 21/67373* (2013.01); *H01L 21/67383* (2013.01)

(58) Field of Classification Search
CPC ......... H01L 21/67373; H01L 21/67383; H01L 21/673; H01L 21/6732
USPC ......................................... 206/710–712, 832
See application file for complete search history.

(56) References Cited

U.S. PATENT DOCUMENTS

| 2,953,253 | A | * | 9/1960 | Henderson | ............. B65D 85/48 211/41.14 |
| 4,228,902 | A | * | 10/1980 | Schulte | ............... H01L 21/6732 118/500 |
| 5,128,833 | A | * | 7/1992 | Lin | ...................... H05K 7/1408 211/41.17 |
| 5,638,958 | A | * | 6/1997 | Sanchez | ............. H01L 21/6732 118/500 |
| 5,853,214 | A | * | 12/1998 | Babbs | ................. H01L 21/6734 294/161 |
| 5,960,960 | A | * | 10/1999 | Yamamoto | ........ H01L 21/67326 206/454 |

(Continued)

FOREIGN PATENT DOCUMENTS

| JP | 03173455 A | 7/1991 |
| JP | 08053187 A | 2/1996 |

(Continued)

OTHER PUBLICATIONS

Search report issued in counterpart Singapore patent application No. 10202005161W, dated Mar. 5, 2021.

*Primary Examiner* — Chun Hoi Cheung

(74) *Attorney, Agent, or Firm* — Greer Burns & Crain Ltd.

(57) ABSTRACT

An anti-ejection apparatus for wafer units includes a lock bar and a guide pin. The lock bar alternately has a plurality of lock portions and a plurality of unlock portions. The lock portions are located at heights corresponding to those of insertion slots of a side plate of a cassette, and enable blocking of the insertion slots. The unlock portions enable unblocking of the insertion slots. The guide pin is connected to the lock bar and is disposed protruding downward from a bottom portion of the side plate of the cassette. When the guide pin is pressed upward at its lower end portion, the unlock portions and the insertion slots are communicated with each other. When the pressing of the lower end portion of the guide pin is cancelled, on the other hand, the insertion slots are blocked by lock portions.

4 Claims, 7 Drawing Sheets

(56) References Cited

U.S. PATENT DOCUMENTS

| | | | | |
|---|---|---|---|---|
| 7,086,540 B2* | 8/2006 | Huang | ............... | H01L 21/6734 |
| | | | | 211/183 |
| 7,500,564 B2* | 3/2009 | Choi | ................... | H01L 21/6732 |
| | | | | 206/454 |
| 7,876,575 B2* | 1/2011 | Hosokawa | ........ | H01L 21/67383 |
| | | | | 361/797 |
| 8,905,239 B2* | 12/2014 | Kim | ................... | H01L 21/6732 |
| | | | | 206/711 |
| 9,117,864 B2* | 8/2015 | Dejima | ............... | H01L 21/6732 |
| 2009/0142176 A1* | 6/2009 | Choi | ................... | H01L 21/6732 |
| | | | | 414/806 |
| 2014/0231370 A1* | 8/2014 | Han | ................... | H01L 21/6734 |
| | | | | 211/41.1 |

FOREIGN PATENT DOCUMENTS

| | | |
|---|---|---|
| JP | 2013157381 A | 8/2013 |
| JP | 2016119354 A | 6/2016 |

* cited by examiner

ANTI-EJECTION APPARATUS FOR WAFER UNITS

BACKGROUND OF THE INVENTION

Field of the Invention

The present invention relates to an anti-ejection apparatus for wafer units.

Description of the Related Art

To divide a semiconductor wafer into chips, a cutting machine called a dicing saw is used. As a preparation for processing wafers by a cutting machine of this type, the wafers are each fixed on a ring-shaped frame via an adhesive tape and are contained in a cassette. The cassette with the wafers contained therein is transferred by an operator to the cutting machine, and is mounted on a cassette mounting table disposed on the cutting machine. The wafers are sequentially carried out from the cassette, subjected to dicing processing, and then carried back into the cassette. The cassette with the diced wafers contained therein is again transferred by the operator to a machine that performs the next step. To prevent accidental ejection of wafers from such a cassette during its transfer, various cassettes provided with different lock mechanisms have been proposed (see, for example, JP 2013-157381 A and JP 2016-119354 A).

SUMMARY OF THE INVENTION

The lock mechanisms disclosed in JP 2013-157381 A and JP 2016-119354 A, however, involve a problem that changes have to be made to a cassette main body, a cassette mounting apparatus or the like, leading to higher cost.

The present invention therefore has as an object thereof the provision of an anti-ejection apparatus for wafer units, which can prevent accidental ejection of the wafer units from a cassette with reduced alterations or changes to a cassette or a processing machine on which the cassette is to be mounted.

In accordance with an aspect of the present invention, there is provided an anti-ejection apparatus for wafer units of ring-shaped frames and wafers integrated together via adhesive tapes, respectively. The anti-ejection apparatus is for use in attachment to a cassette including a pair of side plates, whose inner surfaces are provided with pluralities of insertion slots, each insertion slot of one of the side plates facing a corresponding one of the insertion slots of the other side plate, to be inserted with the wafer units, respectively, a rear stop portion configured to support the wafer units at rear edges thereof, and an opening formed between the paired side plates on a side opposite the rear stop portion, by which the anti-ejection apparatus prevents accidental ejection of the wafer units from the cassette. The anti-ejection apparatus includes a lock bar and a guide pin. The lock bar is configured to be detachably provided on one of the side plates on a side of the opening, and alternately has a plurality of lock portions and a plurality of unlock portions in a top-down direction, the lock portions are located at heights corresponding to those of the associated insertion slots and are configured to enable blocking of the associated insertion slots. The unlock portions are configured to enable unblocking of the associated insertion slots. The guide pin is connected to the lock bar and is disposed protruding downward from a bottom portion of the one side plate so that, when pressed upward at a lower end portion thereof, the guide pin biases the lock bar upward. The lock bar is configured so that, when the guide pin is pressed upward at the lower end portion thereof, the lock bar is biased upward to bring the unlock portions into register with the associated insertion slots, by which the unlock portions and the associated insertion slots are communicated with each other and the cassette is brought into an open state that the wafer units can be inserted and taken out through the opening. The lock bar is also configured so that, when the pressing of the lower end portion of the guide pin is cancelled, the lock bar moves downward by an own weight thereof to make the unlock portions assume different heights from the associated insertion slots in the top-down direction, by which the associated insertion slots are blocked by the lock portions and the cassette is brought into a closed state that accidental ejection of the wafer units inserted in the insertion slots of both the side plates can be prevented.

According to the present invention, accidental ejection of wafer units from a cassette can be prevented with reduced alterations or changes to the cassette or a processing machine on which the cassette is to be mounted.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

With reference to the drawings, a description will hereinafter be made in detail about an embodiment of the present invention and its modifications. However, the present invention shall not be limited by details that will be described in the subsequent embodiment and modifications. The elements of configurations that will hereinafter be described include those readily conceivable to persons skilled in the art and substantially the same ones. Further, the configurations that will hereinafter be described can be combined appropriately. Furthermore, various omissions, replacements and modifications of configurations can be made without departing from the spirit of the present invention.

Embodiment

Figure 1:
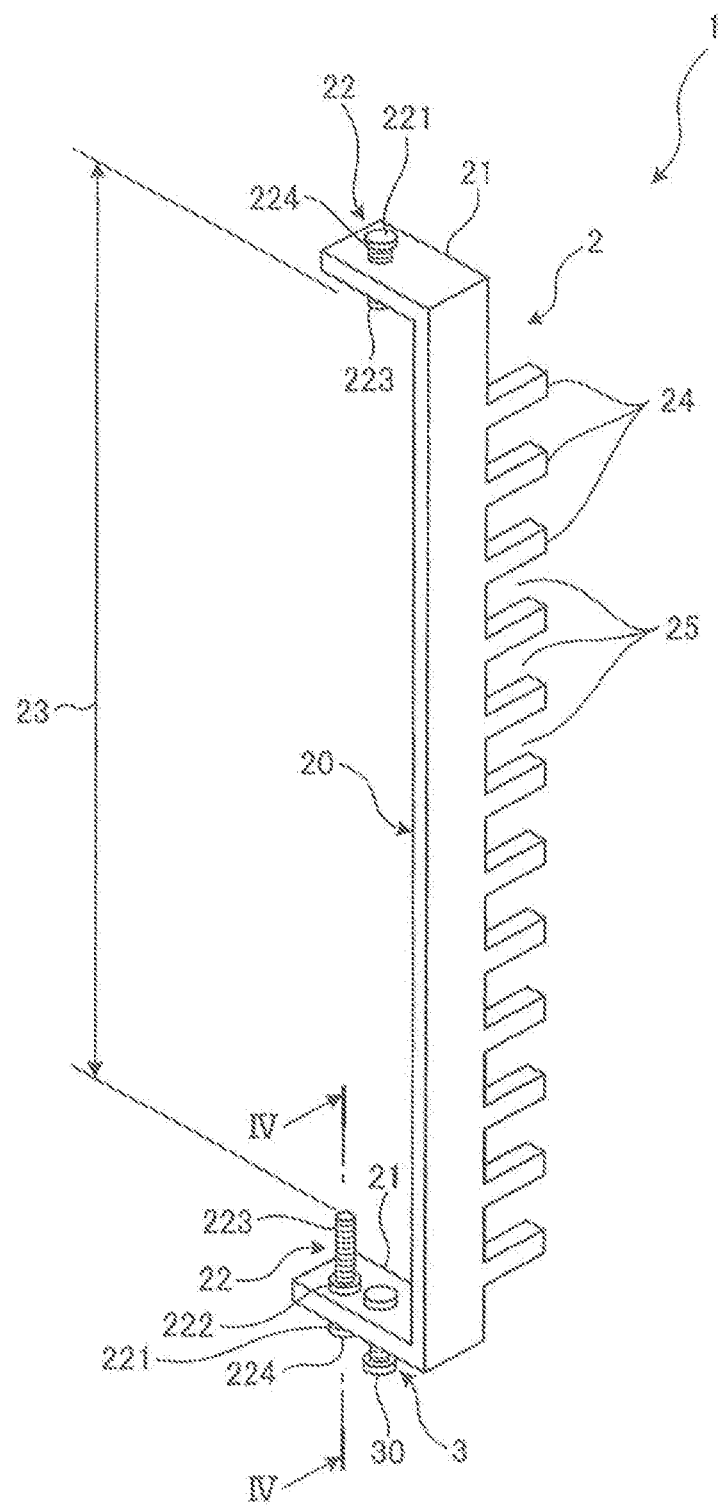
FIG. 1 is a perspective view depicting a configuration example of an anti-ejection apparatus according to an embodiment for wafer units.
Figure 2:
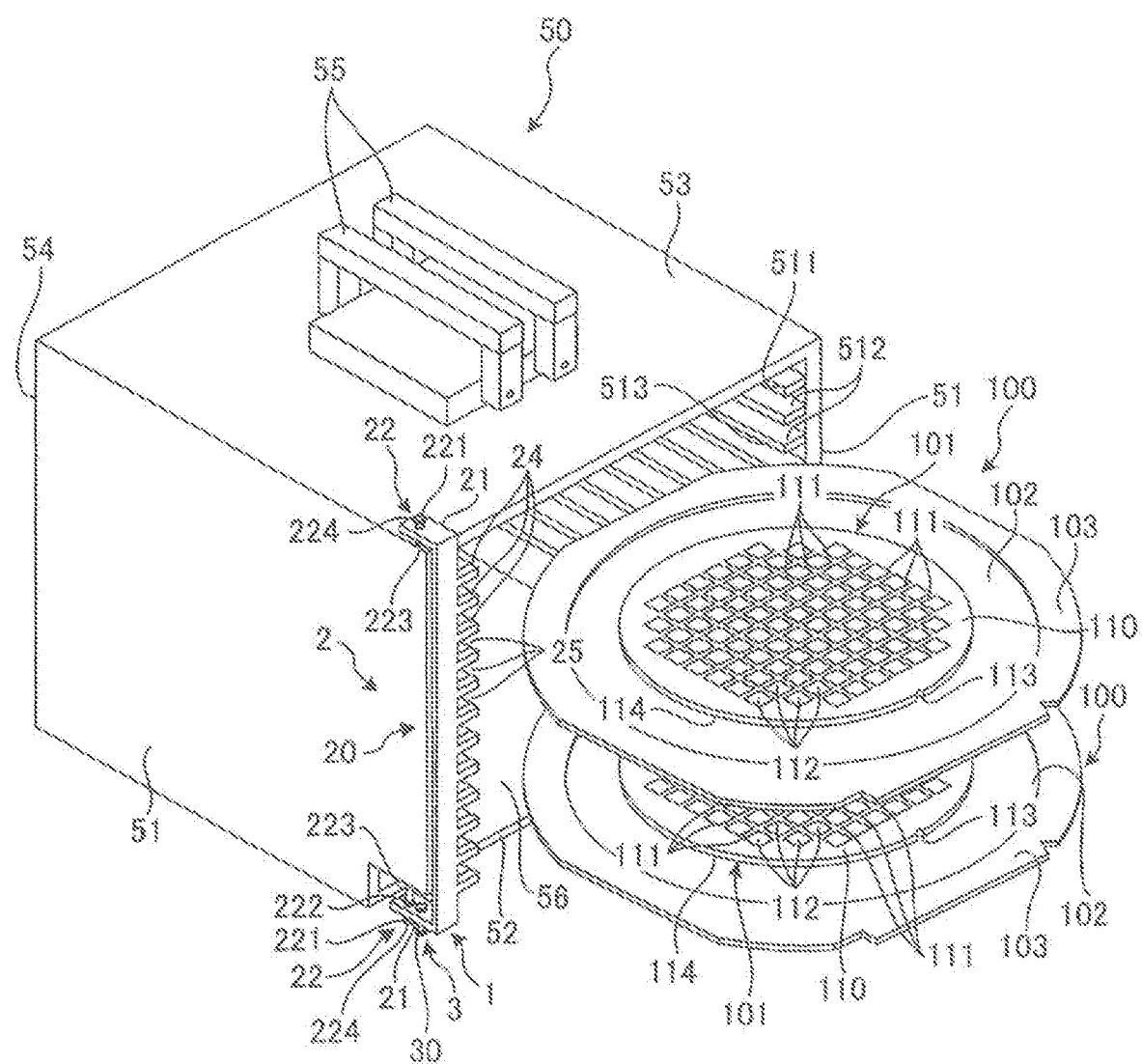
FIG. 2 is a perspective view depicting the anti-ejection apparatus of FIG. 1 together with a cassette to which the anti-ejection apparatus is attached.
Figure 3:
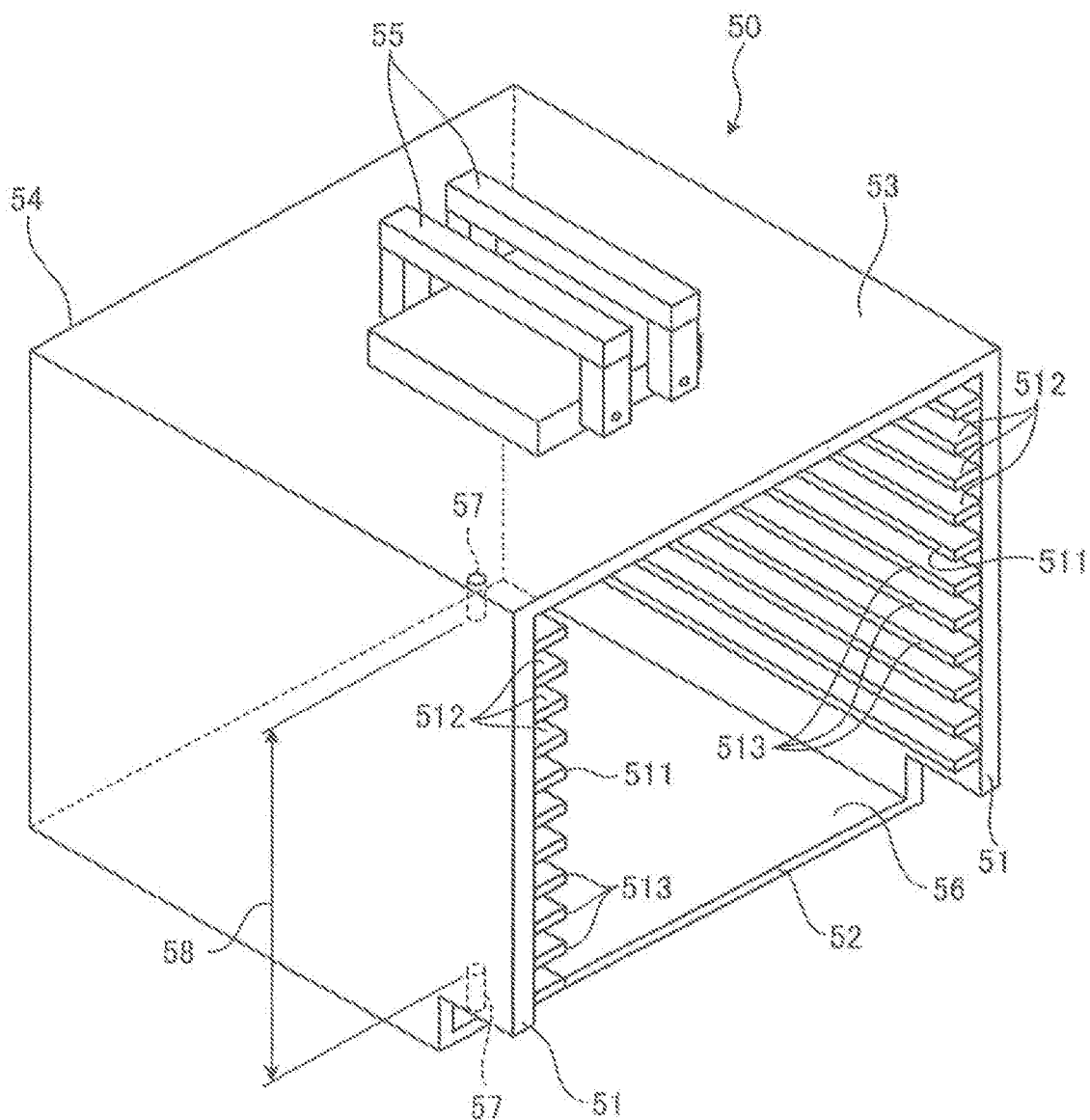
FIG. 3 is a perspective view of the cassette depicted in FIG. 2.
Figure 4:
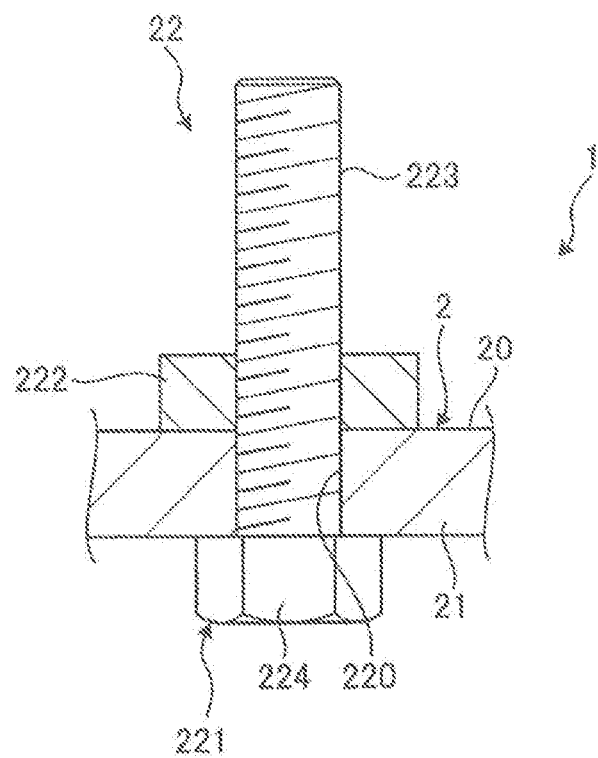
FIG. 4 is a cross-sectional view taken along line IV-IV in FIG. 1.

An anti-ejection apparatus according to the embodiment of the present invention for wafer units will be described based on the relevant figures of the drawings. FIG. 1 is a perspective view depicting a configuration example of an anti-ejection apparatus according to an embodiment for wafer units. FIG. 2 is a perspective view depicting the anti-ejection apparatus of FIG. 1 together with a cassette to which the anti-ejection apparatus is attached. FIG. 3 is a perspective view of the cassette depicted in FIG. 2. FIG. 4 is a cross-sectional view taken along line IV-IV in FIG. 1.

The anti-ejection apparatus of FIG. 1 according to the embodiment for the wafer units (hereinafter simply referred to as "the anti-ejection apparatus") is used in attachment to a cassette 50 as depicted in FIG. 2. The cassette 50 is a container that as depicted in FIG. 2, can contain a plurality of wafer units 100 of ring-shaped frames 103 and wafers 101 integrated together via adhesive tapes 102, respectively, and are used in various processing machines employed in a semiconductor manufacturing process or the like. Examples of the processing machines include a cutting machine for cutting the wafers 101, a grinding machine for grinding the wafers 101, a polishing machine for polishing the wafers 101, and a laser processing machine for processing the wafer 101 with a laser beam.

The wafers 101 are, for example, disk-shaped semiconductor wafers, optical device wafers or the like, which are formed of a base material such as silicon, sapphire or gallium. As depicted in FIG. 2, each wafer 101 includes devices 112 formed in regions of a front side 110, which are divided by grid-patterned streets 111. Each wafer 101 also includes a notch 113, which is formed in an outer edge thereof and indicates a crystal orientation. The adhesive tape 102 is bonded to a back side 114 of each wafer 101, the back side 114 being on a side opposite the front side 110, and the adhesive tape 102 is also bonded at an outer edge portion thereof to the ring-shaped frame 103 to hold the wafer 101 in an opening of the ring-shaped frame 103, by which each wafer unit 100 is formed.

The cassette 50 is mounted on a processing machine, and contains the wafers 101 before and after their processing by the processing machine. The cassette 50 is also used to contain the wafers 101 and to transfer them between plural processing machines.

As depicted in FIGS. 2 and 3, the cassette 50 has a pair of side plates 51 opposing each other, a bottom plate 52, a top plate 53, and a rear plate 54 as a rear stop portion. The paired side plates 51, bottom plate 52, top plate 53 and rear plate 54 are each formed in a planar shape. The paired side plates 51 oppose each other with an interval maintained therebetween in a horizontal direction when the cassette 50 is mounted on the processing machine.

The paired side plates 51 include partition ribs 513 on inner surfaces 511 thereof, where the side plates 51 face each other. The partition ribs 513 on the inner surface 511 of each side plate 51 are arranged at equal intervals in a vertical direction when the cassette 50 is mounted on the processing machine. The partition ribs 513 on the inner surface 511 of one of the side plates 51 and the partition ribs 513 on the inner surface 511 of the other side plate 51 oppose each other, and are located at the same heights, respectively. By each adjacent two partition ribs 513 and its associated inner surface 511, an insertion slot 512 (see FIGS. 6 and 8) is formed. With the cassette 50 mounted on the processing machine, a plurality of insertion slots 512 (see FIGS. 6 and 8) extends straight on and along the inner surface 511 of each side plate 51 from the opening 56 toward the rear plate 54 of the cassette 50.

In other words, when the cassette 50 is mounted on the processing machine, the insertion slots 512 arranged on the inner surfaces 511 of the paired side plates 51 are located at different heights so that each insertion slot 512 on the inner surface 511 of the one side plate 51 faces the horizontally corresponding one of the insertion slots 512 on the inner surfaces 511 of the other side plate 51. Therefore, the insertion slots 512 horizontally face each other at the different heights between the paired side plates 51. One of the wafer units 100 to be contained in the cassette 50 is inserted at the outer edge portion thereof into desired facing two insertion slots 512, and is supported by the partition ribs 513 located on lower sides of the two insertion slots 512. In other words, the insertion slots 512 are used as slots for inserting the wafer units 100 into the cassette 50.

The bottom plate 52 connects the paired side plates 51 to each other at lower edges thereof, and the top plate 53 connects the paired side plates 51 to each other at upper edges thereof. The top plate 53 is provided with a handle 55, which is grasped by operators or the like of various processing machines to transfer the cassette 50.

The rear plate 54 supports the wafer units 100 at rear edges thereof, and connects the paired side plates 51, bottom plate 52 and top plate 53 together at rear-side edges thereof as viewed in FIGS. 2 and 3, and closes up an opening defined by these rear-edge edges. The frames 103 of the wafer units 100, which have been inserted at outer edge portions thereof in the insertion slots 512, are in contact with the rear plate 54, and are supported by the rear plate 54. The rear plate 54 therefore restricts the wafer units 100 from falling out of the cassette 50 from the rear side as viewed in FIGS. 2 and 3.

The cassette 50 also has the opening 56 formed by front-side edges of the paired side plates 51, bottom plate 52 and top plate 53 as viewed in FIGS. 2 and 3. The opening 56 functions as a space communicating an inside and an outside of the cassette 50, and enables to insert and take out the wafer units 100 into and from the insertion slots 512. In other words, the opening 56 enables to place and remove the wafer units 100 into and from the cassette 50.

In this embodiment, the cassette 50 includes attachment recesses 57 in at least one of the paired side plates 51, the one side plate 51 being on a left side as viewed in FIG. 3. The recesses 57, which may hereinafter be referred to as "the upper recess 57" and "the lower recess 57," are formed in an upper surface and a lower surface, respectively, of an end portion of the one side plate 51 on the side of the opening 56, and therefore the recesses 57 are included in a pair in this embodiment. The recesses 57 are formed extending downward and upward from the upper surface and lower surface, respectively, and have a circular shape in plan view. In this embodiment, the recesses 57 are each formed with a constant internal diameter over the entire length thereof. It is to be noted that in this invention, the cassette 50 may include attachment recesses 57 not only in one of the paired side plates 51 but also in the other side plate 51.

The anti-ejection apparatus 1 according to this embodiment is attached to the cassette 50, and prevents accidental ejection of the wafer units 100 from the cassette 50 through the opening 56. As depicted in FIGS. 1 and 2, the anti-ejection apparatus 1 includes a lock bar 2 and a guide pin 3.

The lock bar 2 includes a bar main body 20 that extends linearly, a pair of attachment parts 21 that continuously extend from longitudinal opposite ends of the bar main body 20, and bar attachment fixtures 22. The bar main body 20 has an overall length formed longer than an overall length of the one side plate 51 in the vertical direction when the cassette 50 is mounted on the processing machine.

The paired attachment parts 21 both extend in the same direction from the longitudinal opposite ends of the bar main body 20, respectively. In this embodiment, the direction of length of each attachment part 21 intersects the direction of length of the bar main body 20 at right angles.

The bar attachment fixtures 22 are arranged on the attachment parts 21, respectively. Described specifically, in this embodiment, the bar attachment fixtures 22 are arranged in a pair, and detachably secure the lock bar 2 on the end portion of the one side plate 51 on the side of the opening 56. As depicted in FIG. 4, each bar attachment fixture 22 includes a through-hole 220 extending through the associated attachment part 21, a bolt 221, and a nut 222. It is to be noted that, although FIG. 4 depicts a cross-section of the lower bar attachment fixture 22 as viewed in FIG. 1, the upper bar attachment fixture 22 as viewed in FIG. 1 and its elements are identified by like reference numerals and their description is omitted herein because the paired bar attachment fixtures 22 have the same configuration.

In this embodiment, the through-hole 220 has a circular shape in plan view, and has a constant internal diameter over the entire length thereof. The bolt 221 includes a cylindrical threaded portion 223 with a thread formed on an outer peripheral surface thereof, and a hexagonal head portion 224 formed in continuation with an end of the threaded portion 223 and having a greater diameter than the threaded portion 223. The threaded portion 223 has an outer diameter that is substantially equal to an inner diameter of the through-hole 220. The nut 222 threadedly engages an outer periphery of the threaded portion 223 of the bolt 221.

As depicted in FIGS. 1 and 4, the threaded portions 223 of the bolts 221 are inserted through the through-holes 220 so that the threaded portions 223 are directed against each other, the nuts 222 are threadedly engaged with the threaded portions 223 to hold the attachment parts 21 between the nuts 222 and the threaded portions 223, thereby fixing the bolts 221 on the attachment parts 21. Further, the threaded portions 223 of the respective bolts 221 are inserted at free end portions thereof in the corresponding recesses 57, by which the bar attachment fixtures 22 attach the bar main body 20, that is, the lock bar 2 to the cassette 50.

By loosening the nuts 222 with the bar main body 20, in other words, the lock bar 2 kept attached to the cassette 50, the bolts 221 can be removed from the recesses 57 and through-holes 220. By removing the bolts 221 from the recesses 57 and through-holes 220, the bar main body 20, in other words, the lock bar 2 can be detached from the end portion of the one side plate 51, the end portion being on the side of the opening 56. Further, a distance 23 (see FIG. 1) between free ends of the bolts 221 is set longer than a distance 58 (see FIG. 3) between a bottom wall of the upper recess 57 in the one side plate 51 and a top wall of the lower recess 57 in the one side plate 51, so that the paired bar attachment fixtures 22 support the bar main body 20, in other words, the lock bar 2 movably relative to the one side plate 51 in the vertical direction.

The bar main body 20 includes a plurality of lock portions 24 and a like plurality of unlock portions 25 alternately in the longitudinal direction thereof. The lock portions 24 are arranged at equal intervals in the vertical direction, and extend from the bar main body 20 toward the other side plate 51. In this embodiment, the lock portions 24 have a thickness substantially equal to that of the partition ribs 513, and are arranged as many as the partition ribs 513. As the thickness of each lock portion 24 is substantially equal to the thickness of each partition rib 513, the thickness of each lock portion 24 corresponds to the height of each insertion slot 512. When the lock portions 24 are placed at locations which are horizontally leveled with the insertion slots 512, respectively, the lock portions 24 block the insertion slots 512, thereby restricting the outer edge portions of the frames 103 of the wafer units 100 from moving in the insertion slots 512. As described above, the lock portions 24 have the thickness corresponding to the height of the insertion slots 512, and therefore can block the insertion slots 512.

Each unlock portion 25 is a space between each two adjacent lock portions 24. When the unlock portions 25 are placed at locations which are horizontally leveled with the insertion slots 512, respectively, the unlock portions 25 communicate to the insertion slots 512, thereby allowing the outer edge portions of the frames 103 of the wafer units 100 to move in the insertion slots 512. As described above, the unlock portions 25 are configured to be communicable with the insertion slots 512.

The guide pin 3 is attached to the lower attachment part 21 of the bar main body 20 of the lock bar 2, and is fixedly secured to the lower attachment part 21. The guide pin 3 protrudes downward from a lower surface of the lower attachment part 21, and when the lock bar 2 is attached to the cassette 50, normally protrudes downward from the bottom portion of the one side plate 51. When the cassette 50 is mounted on the processing machine, the guide pin 3 is hence pressed at a lower end portion 30 thereof upward from the processing machine. When pressed upward at the lower end portion 30, the guide pin 3 moves (biases) the lock bar 2 upward.

Figure 5:
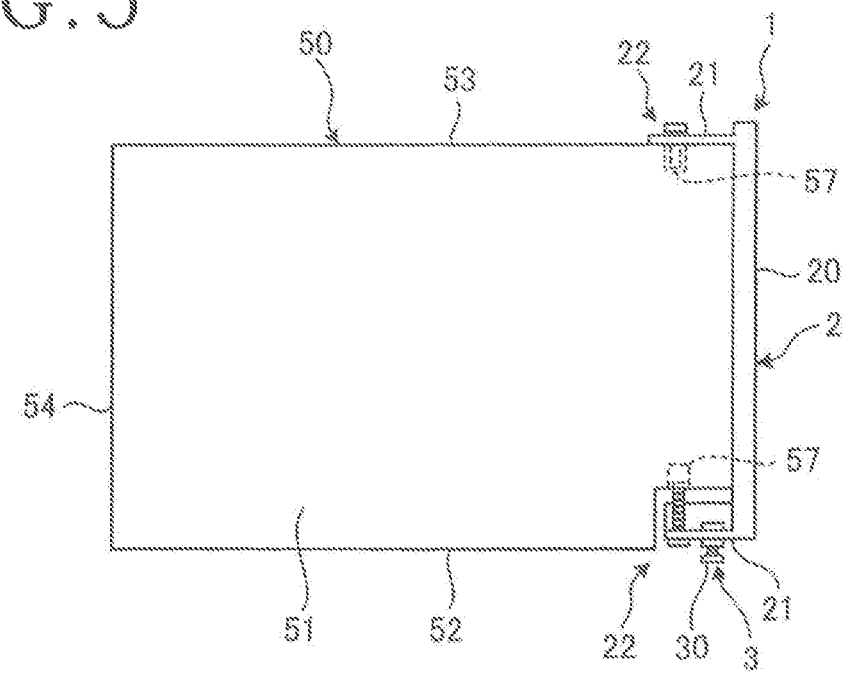
FIG. 5 is a side view schematically illustrating the anti-ejection apparatus of FIG. 1 during transfer or the like of the cassette depicted in FIG. 2.
Figure 6:
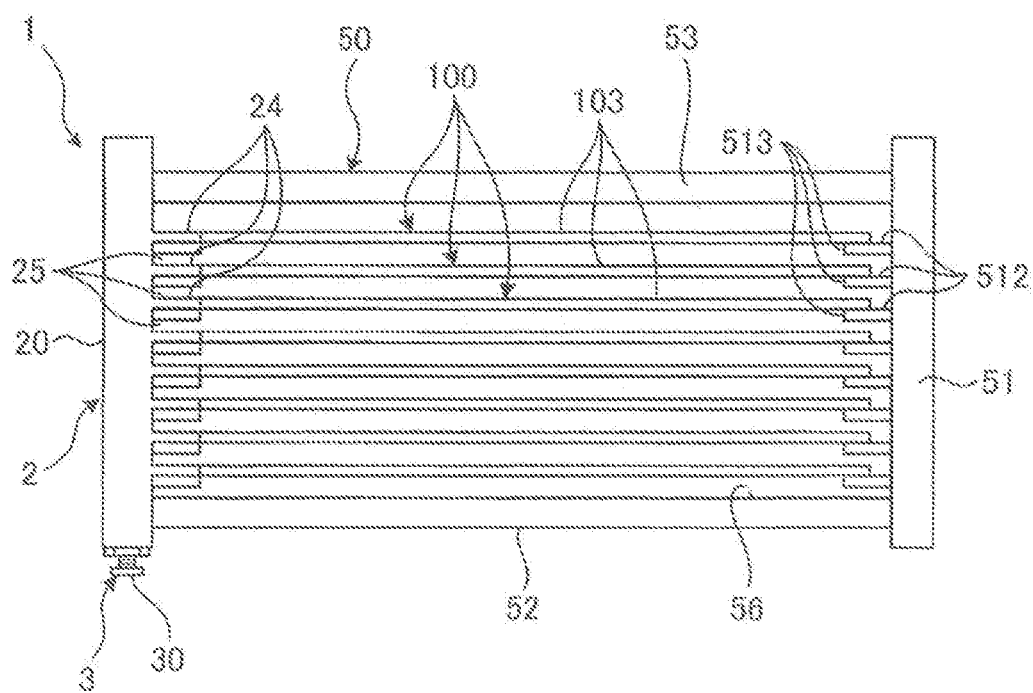
FIG. 6 is a front view schematically illustrating the cassette and the anti-ejection apparatus illustrated in FIG. 5.
Figure 7:
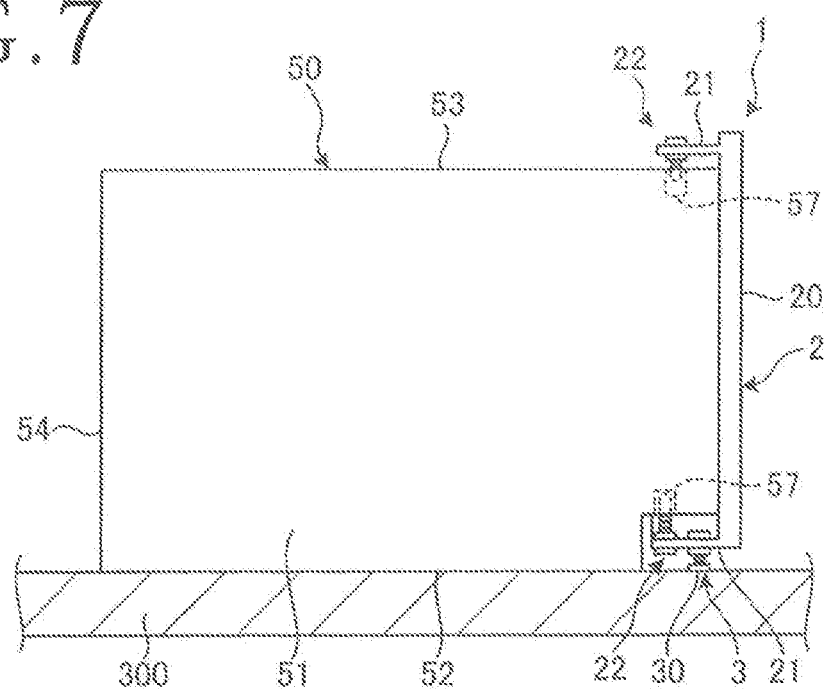
FIG. 7 is a side view schematically illustrating the anti-ejection apparatus of FIG. 1 when the cassette depicted in FIG. 2 is mounted on a processing machine.
Figure 8:
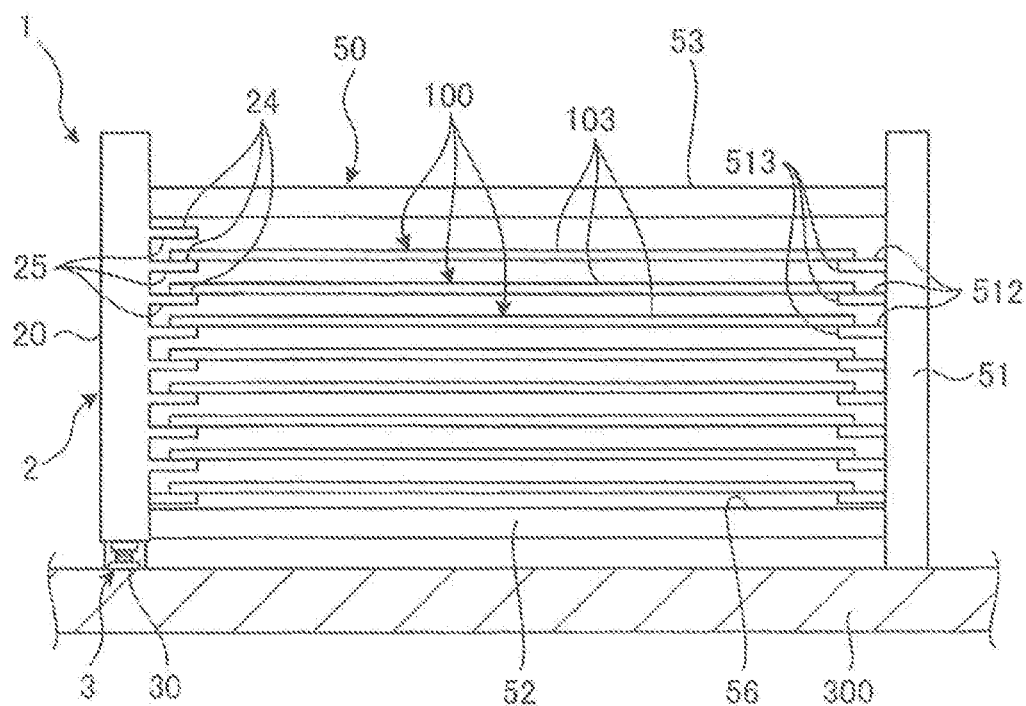
FIG. 8 is a front view schematically illustrating the cassette and the anti-ejection apparatus illustrated in FIG. 7.

Next, a description will be made of operations of the anti-ejection apparatus 1 according to this embodiment when the anti-ejection apparatus 1 is attached to the cassette 50 with the wafers 101 contained therein. FIG. 5 is a side view schematically illustrating the anti-ejection apparatus of FIG. 1 during transfer or the like of the cassette depicted in FIG. 2. FIG. 6 is a front view schematically illustrating the cassette and the anti-ejection apparatus illustrated in FIG. 5. FIG. 7 is a side view schematically illustrating the anti-ejection apparatus of FIG. 1 when the cassette depicted in FIG. 2 is mounted on a processing machine. FIG. 8 is a front view schematically illustrating the cassette and the anti-ejection apparatus illustrated in FIG. 7.

When the anti-ejection apparatus 1 according to this embodiment is attached to the cassette 50 and the cassette 50 is transferred, for example, between processing machines, the handle 55 of the cassette 50 is grasped by the operator. Therefore, the lower end portion 30 of the guide pin 3 is not pressed upward, or upward pressing of the lower end portion 30 is cancelled. As illustrated in FIGS. 5 and 6, the anti-ejection apparatus 1 therefore moves downward relative to the cassette 50 by its own weight.

Then, the upper attachment part 21 comes into contact with the upper surface of the one side plate 51, and the lower end portion 30 of the guide pin 3 protrudes downward beyond the lower surface of the one side plate 51. As illustrated in FIG. 6, the lock portions 24 are horizontally leveled with the insertion slots 512, respectively, and the unlock portions 25 assume different heights from the insertion slots 512 in the top-down direction, in other words, in the vertical direction. As a result, the lock portions 24 block the insertion slots 512 to restrict movements of the frames 103 in the insertion slots 512. The anti-ejection apparatus 1 therefore restricts the wafers 101 from being placed in or removed from the cassette 50. The cassette 50 is hence brought into a closed state that the wafer units 100 inserted at the outer edge portions of the frames 103 thereof in the insertion slots 512 are not ejectable out of the cassette 50, thereby enabling to prevent accidental ejection of the wafers 101 from the cassette 50.

When the cassette 50 is mounted on a cassette mounting table 300 of the processing machine, the lower end portion 30 of the guide pin 3 of the anti-ejection apparatus 1 according to this embodiment is pressed upward so that as illustrated in FIGS. 7 and 8, the lock bar 2 is moved (biased) upward and the upper attachment part 21 is made apart from the upper surface of the one side plate 51. As illustrated in FIG. 8, the lock portions 24 are hence horizontally leveled with the partition ribs 513, and the unlock portions 25 are horizontally brought into register with the insertion slots 512.

As a result, the unlock portions 25 and the insertion slots 512 are communicated with each other to allow the frames 103 to move in the insertion slots 512. The anti-ejection apparatus 1 therefore permits placing or removing the wafer units 100 into and from the cassette 50. As a consequence, the cassette 50 is brought into an open state that the wafer units 100 can be inserted into and taken out from the insertion slots 512 through the opening 56. The anti-ejection apparatus 1 therefore permits placing and removing the wafers 101 into and from the cassette 50.

As has been descried above, the anti-ejection apparatus 1 according to this embodiment includes the paired bar attachment fixtures 22 that allow the bar main body 20 of the lock bar 2 to move relative to the cassette 50, and therefore can be attached to an existing cassette 50 with recesses 57 formed in one of the side plates 51. The anti-ejection apparatus 1 can also be attached to another existing cassette 50 having no recesses 57 formed in any of side plates 51 if the recesses 57 are formed in one of the side plates 51.

Accordingly, the simple retrofitting of the anti-ejection apparatus 1 to the existing cassette 50 enables to prevent accidental ejection of the wafers 101 contained in the cassette 50. As a consequence, alterations to the cassette 50 and/or changes to machines can be reduced, thereby contributing to a cost saving.

First Modification

Figure 9:
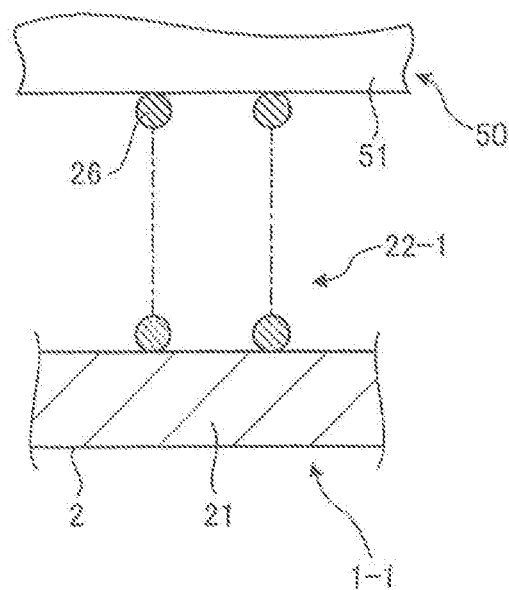
FIG. 9 is a cross-sectional view of a lower bar mounting fixture of an anti-ejection apparatus according to a first modification of the embodiment for wafer units.

An anti-ejection apparatus according to a first modification of the embodiment of the present invention for wafer units will be described based on the relevant figure of the drawings. FIG. 9 is a cross-sectional view of a lower bar mounting fixture of the anti-ejection apparatus according to the first modification of the embodiment for wafer units. In FIG. 9, like elements as in the embodiment are identified by like reference numerals, and their description is omitted herein.

The anti-ejection apparatus 1-1 according to the first modification for the wafer units (hereinafter simply referred to as "the anti-ejection apparatus") has the same configuration as the anti-ejection apparatus 1 according to the embodiment except for a difference in the configuration of the bar attachment fixtures 22 that the recesses 57 are not included. As depicted in FIG. 9, a lower bar attachment fixture 22-1 of the anti-ejection apparatus 1-1 is fixedly secured between the lower surface of the end portion of the one side plate 5, the end portion being located on the side of the opening 56, and the lower attachment part 21, and is formed of an elastic member 26 that is elastically deformable. Through elastic deformations of the elastic member 26, the bar attachment fixture 22-1 supports the bar main body 20, specifically the lock bar 2 movably relative to the one side plate 51 in the vertical direction. FIG. 9 depicts a coil spring as an example of the elastic member 26. In the present invention, however, the elastic member 26 is not limited to such a coil spring, but may be, for example, a sponge rubber or the like.

In the anti-ejection apparatus 1-1, the upper bar attachment part 21 also includes a similar elastic member 26 as an upper bar attachment fixture. The anti-ejection apparatus 1-1 therefore includes the bar attachment fixtures 22-1 in a pair, which allow the bar main body 20 of the lock bar 2 to move relative to the cassette 50. The anti-ejection apparatus 1-1 can hence be attached to the existing cassette 50 by fixedly securing the elastic members 26, which make up the bar attachment fixtures 22-1, to the lower surface and upper surface of the one end portion of the one side plate 51, the end portion being located on the side of the opening 56. Accordingly, the simple retrofitting of the anti-ejection apparatus 1-1 to the existing cassette 50 enables to prevent accidental ejection of the wafers 101 contained in the cassette 50, thereby bringing about an advantage effect that alterations and/or changes to the cassette 50 and processing machines, on which the cassette 50 is to be mounted, can be reduced.

Second Modification

Figure 10:
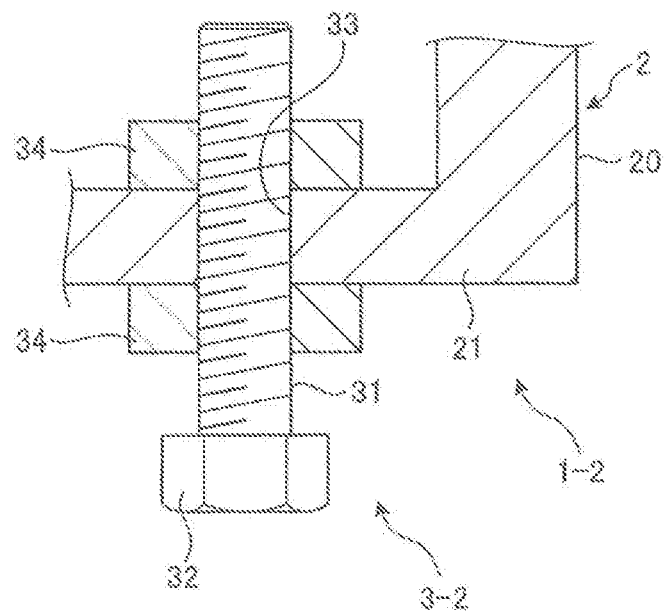
FIG. 10 is a cross-sectional view of a guide pin of an anti-ejection apparatus according to a second modification of the embodiment for wafer units.

An anti-ejection apparatus according to a second modification of the embodiment of the present invention for wafer units will be described based on the relevant figure of the drawings. FIG. 10 is a cross-sectional view of a guide pin of the anti-ejection apparatus according to the second modification of the embodiment for the wafer units. In FIG. 10, like elements as in the embodiment are identified by like reference numerals, and their description is omitted herein.

The anti-ejection apparatus 1-2 according to the second modification for the wafer units (hereinafter simply referred to as "the anti-ejection apparatus") has the same configuration as the anti-ejection apparatus 1 according to the embodiment except for a difference in the configuration for attachment of a guide pin 3-2 to the lower attachment part 21. As depicted in FIG. 10, the guide pin 3-2 of the anti-ejection apparatus 1-2 includes a cylindrical threaded portion 31 with a thread formed on an outer peripheral surface thereof, and a hexagonal head portion 32 formed in continuation with an end of the threaded portion 31 and having a greater diameter than the threaded portion 31.

The threaded portion 31 is inserted through a through-hole 33 formed in the lower attachment part 21 so that the threaded portion 31 is directed upward, and the lower attachment part 21 is held between a pair of nuts 34 threadedly engaged with the threaded portion 31, by which the guide pin 3-2 is attached to the lower attachment part 21. In the guide pin 3-2, the head portion 32 corresponds to the lower end portion 30, and the amount of protrusion of the head portion 32 from the lower attachment part 21 can be changed by adjusting the positions of the paired nuts 34 relative to the threaded portion 31.

The anti-ejection apparatus 1-2 includes the paired bar attachment fixtures 22, which allow the bar main body 20 of the lock bar 2 to move relative to the cassette 50. Similar to the embodiment, the simple retrofitting of the anti-ejection apparatus 1-2 to the existing cassette 50 therefore enables to prevent accidental ejection of the wafers 101 contained in the cassette 50, thereby bringing about an advantage effect that alterations and/or changes to the cassette 50 and processing machines, on which the cassette 50 is to be mounted, can be reduced.

In addition, the anti-ejection apparatus 1-2 can change the amount of protrusion of the head portion 32 as a lower end portion of the guide pin 3-2 from the lower attachment part 21, and therefore can be attached to various existing cassettes.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. An anti-ejection apparatus for wafer units of ring-shaped frames and wafers integrated together via an adhesive tape, respectively, the anti-ejection apparatus being configured to be attached to a cassette including a pair of side plates, whose inner surfaces are provided with pluralities of insertion slots, each insertion slot of one of the side plates facing a corresponding one of the insertion slots of the other side plate, to be inserted with the wafer units, respectively, a rear stop portion configured to support the wafer units at rear edges thereof, and an opening formed between the paired side plates on a side opposite the rear stop portion, by which the anti-ejection apparatus prevents accidental ejection of the wafer units from the cassette, the anti-ejection apparatus comprising:

a lock bar configured to be detachably provided on one of the side plates on a side of the opening, the lock bar including a bar main body alternately having a plurality of lock portions and a plurality of unlock portions in a top-down direction, the lock portions being located at heights corresponding to those of the associated insertion slots and being configured to enable blocking of the associated insertion slots, and the unlock portions being configured to enable unblocking of the associated insertion slots, and a paired attachment parts each extending from opposite ends of the bar main body and having a bar attachment fixture, each of the bar attachment fixture being configured to extend towards the other of the bar attachment fixture and secured to one of a pair of recesses formed in one of the pair of side plates of the cassette, a guide pin connected to the attachment part that extends from a lower end of the bar main body of the lock bar and disposed protruding downward from the attachment part below a bottom portion of the one side plate so that, when pressed upward at a lower end portion thereof, the guide pin biases the lock bar upward, wherein the lock bar is configured so that, when the guide pin is pressed upward at the lower end portion thereof, the lock bar is biased upward to bring the unlock portions into register with the associated insertion slots, by which the unlock portions and the associated insertion slots are communicated with each other and the cassette is brought into an open state that the wafer units are able to be inserted and taken out through the opening, and wherein the lock bar is also configured so that, when the pressing of the lower end portion of the guide pin is cancelled, the lock bar moves downward by an own weight thereof to make the unlock portions assume different heights from the associated insertion slots in the top-down direction, by which the associated insertion slots are blocked by the lock portions and the cassette is brought into a closed state that accidental ejection of the wafer units inserted in the insertion slots of both the side plates is able to be prevented.

2. The anti-ejection apparatus as defined in claim 1, wherein the paired attachment parts extend at a right angle from the bar main body.

3. The anti-ejection apparatus as defined in claim 2, wherein each of the bar attachment fixtures includes a bolt configured to be inserted through a through-hole formed in corresponding one of the paired attachment parts and a nut threaded on the bolt to secure the bolt on the corresponding one of the paired attachment parts.

4. The anti-ejection apparatus as defined in claim 2, wherein each of the bar attachment fixtures includes a pair of nuts each provided on opposite sides of corresponding one of the paired attachment parts for securing a bolt inserted through a through-hole formed in the corresponding one of the paired attachment parts.

* * * * *